(12) United States Patent
Tsumura et al.

(10) Patent No.: US 9,673,232 B2
(45) Date of Patent: Jun. 6, 2017

(54) THIN-FILM TRANSISTOR, ACTIVE MATRIX SUBSTRATE, METHOD OF MANUFACTURING THIN-FILM TRANSISTOR, AND METHOD OF MANUFACTURING ACTIVE MATRIX SUBSTRATE

(71) Applicant: Mitsubishi Electric Corporation, Tokyo (JP)

(72) Inventors: Naoki Tsumura, Kumamoto (JP); Kensuke Nagayama, Kumamoto (JP); Nobuaki Ishiga, Kumamoto (JP); Kazunori Inoue, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/733,670

(22) Filed: Jun. 8, 2015

(65) Prior Publication Data

US 2015/0364503 A1  Dec. 17, 2015

(30) Foreign Application Priority Data

Jun. 12, 2014 (JP) ................................. 2014-121162

(51) Int. Cl.
*H01L 27/14* (2006.01)
*H01L 27/12* (2006.01)
(Continued)

(52) U.S. Cl.
CPC ...... *H01L 27/1244* (2013.01); *H01L 27/1225* (2013.01); *H01L 29/66969* (2013.01); *H01L 29/7869* (2013.01)

(58) Field of Classification Search
CPC ............. H01L 27/1251; H01L 27/1214; H01L 27/3248; H01L 27/3262
(Continued)

(56) References Cited

U.S. PATENT DOCUMENTS 8,283,666 B2 * 10/2012 Kim .................... H01L 29/7869
257/291
8,513,054 B2 * 8/2013 Sasaki ................. H01L 29/7869
257/E21.411
(Continued)

FOREIGN PATENT DOCUMENTS

JP      2005-77822 A      3/2005
JP    2007-281409 A    10/2007
(Continued)

OTHER PUBLICATIONS

Kenji Nomura et al, "Room-temperature fabrication of transparent flexible thin-film transistors using amorphous oxide semiconductors", p. 488-492, vol. 432 of Nature, 2004.

*Primary Examiner* — Tan N Tran
(74) *Attorney, Agent, or Firm* — Studebaker & Brackett PC

(57) ABSTRACT

An oxide semiconductor film and an oxide conductive film are stacked to form a semiconductor layer. The oxide conductive film is made of a material by which the oxide conductive film is etched at a higher speed than the oxide semiconductor film for example with a PAN chemical containing phosphoric acid, nitric acid, and acetic acid. A source electrode and a drain electrode are electrically connected to the oxide semiconductor film through the oxide conductive film at least at an end portion of the source electrode and an end portion of the drain electrode facing each other. A channel region made of the oxide semiconductor film is formed between the source electrode and the drain electrode. The oxide semiconductor film has a substantially tapered shape in cross section at an end face thereof.

15 Claims, 5 Drawing Sheets

(51) Int. Cl.
*H01L 29/786* (2006.01)
*H01L 29/66* (2006.01)
(58) Field of Classification Search
USPC .......................................... 257/59, 72, 432
See application file for complete search history.

(56) References Cited

U.S. PATENT DOCUMENTS

| | | | |
|---|---|---|---|
| 9,391,213 B2* | 7/2016 | Suzumura | H01L 29/78693 |
| 9,401,714 B2* | 7/2016 | Yamazaki | H03K 19/0013 |
| 2009/0189153 A1 | 7/2009 | Iwasaki et al. | |
| 2010/0105164 A1 | 4/2010 | Ito et al. | |
| 2013/0105793 A1 | 5/2013 | Ito et al. | |
| 2013/0271690 A1* | 10/2013 | Matsukizono | H01L 27/1225 |
| | | | 349/46 |
| 2014/0070211 A1 | 3/2014 | Iwasaki et al. | |

FOREIGN PATENT DOCUMENTS

| | | |
|---|---|---|
| JP | 2008-72011 A | 3/2008 |
| JP | 2010-123937 A | 6/2010 |

* cited by examiner

F I G . 9
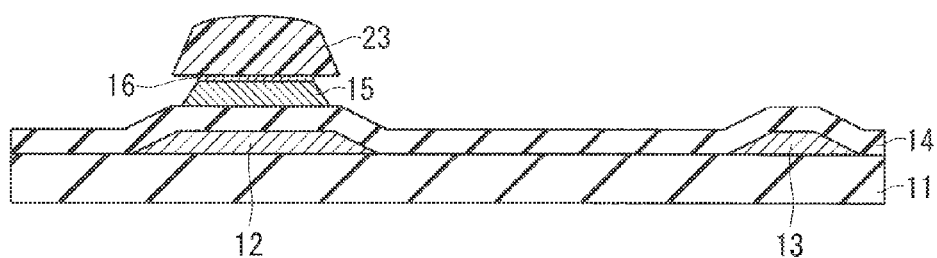
F I G . 1 0
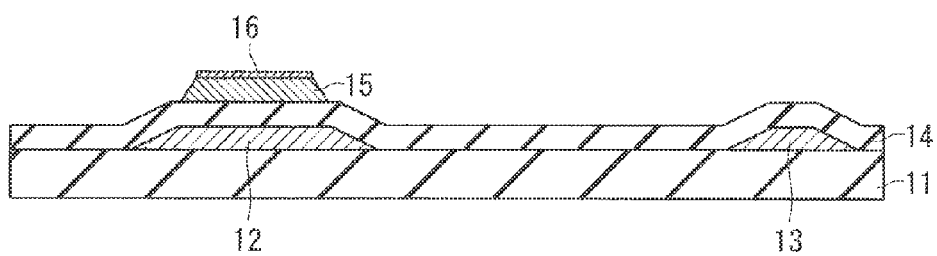
F I G . 1 1
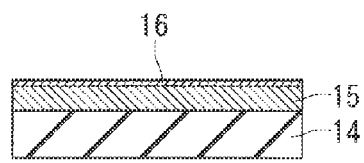
F I G . 1 2
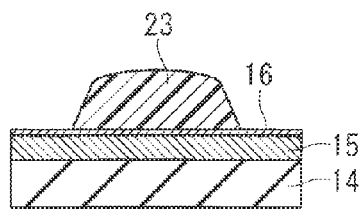

F I G . 1 3
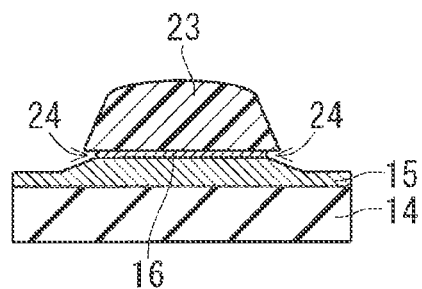
F I G . 1 4
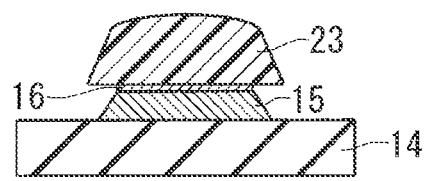
F I G . 1 5
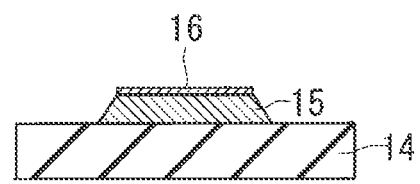

THIN-FILM TRANSISTOR, ACTIVE MATRIX SUBSTRATE, METHOD OF MANUFACTURING THIN-FILM TRANSISTOR, AND METHOD OF MANUFACTURING ACTIVE MATRIX SUBSTRATE

FIELD OF THE INVENTION

The present invention relates to a thin-film transistor used for example in an electrooptic display device such as a liquid crystal display device or an organic electroluminescence display device or in a semiconductor component, an active matrix substrate including the thin-film transistor, a method of manufacturing the thin-film transistor, and a method of manufacturing the active matrix substrate.

BACKGROUND ART

One of examples of a semiconductor device is an electrooptic display device to be used as a display device including a TFT active matrix substrate using a thin-film transistor (abbreviated as a TFT) as a switching element. Such an electrooptic display device is considered as one of flat panel displays as alternatives to a cathode ray tube (CRT) and has been applied actively to products for its features of low power consumption and thinness.

The aforementioned semiconductor device has been required to achieve cost reduction. To simplify manufacturing steps, an inversely staggered structure has mainly been employed conventionally for a TFT using amorphous silicon (Si) in a semiconductor active layer. The inversely staggered structure is called a back channel etching type or a back channel etch type.

Development has been underway actively for a TFT using an oxide semiconductor (hereinafter called an "oxide TFT" in some cases) having higher mobility than conventional amorphous silicon (see for example Japanese Patent Application Laid-Open Nos. 2005-77822 and 2007-281409 and "Room-temperature fabrication of transparent flexible thin-film transistors using amorphous oxide semiconductors," Kenji Nomura et al., pp. 488-492, Vol. 432 of Nature, 2004)

Examples of a light-transmitting conductive film conventionally known include oxide conductive films such as an ITO film containing indium tin oxide (abbreviated as ITO) as a compound of indium oxide $In_2O_3$ with tin oxide $SnO_2$ and an IZO film containing indium zinc oxide (abbreviated as IZO) as a compound of indium oxide $In_2O_3$ with zinc oxide ZnO.

Like these oxide conductive films, an oxide semiconductor film containing the aforementioned oxide semiconductor is insoluble in an alkaline developer for a photoresist and can be etched with a mild acidic solution of oxalic acid and carboxylic acid. Thus, the oxide semiconductor film can advantageously be formed into a pattern easily by wet etching process as process with a chemical.

Meanwhile, the aforementioned oxide semiconductor film easily dissolves further in a publicly-known acidic solution used for etching a metal film to become a source electrode and a drain electrode of a TFT such as a metal film containing chromium (Cr), titanium (Ti), molybdenum (Mo), tantalum (Ta), aluminum (Al), or an alloy of these metals.

Thus, for manufacture of an oxide TFT using an oxide semiconductor film in an active layer, the type of a metal film to become a source electrode and a drain electrode, that of a solution for etching of the metal film, and that of the oxide semiconductor film are selected so as to enable selective etching by which only the metal film is etched and the oxide semiconductor film remains unetched (see Japanese Patent Application Laid-Open No. 2008-72011, for example).

A technique of manufacturing an oxide TFT at low cost is disclosed for example in Japanese Patent Application Laid-Open No. 2010-123937. Japanese Patent Application Laid-Open No. 2010-123937 discloses a manufacturing method by which a process of processing a semiconductor film to become an active layer, a process of processing a metal film to become a source electrode and a drain electrode, and a process of separating an ohmic contact layer formed at a connection interface between the source electrode and an oxide semiconductor film and between the drain electrode and the oxide semiconductor film are performed in one mask step using a halftone mask.

According to the technique of Japanese Patent Application Laid-Open No. 2010-123937, the aforementioned processes are all performed by wet etching to form an end face into a tapered shape. As an etchant for this wet etching, a mixed liquid of phosphoric acid, acetic acid, and nitric acid, a mixed liquid of hydrogen peroxide, ammonia, and water, and ITO-07N (available from KANTO CHEMICAL CO., LTD.) as a commercially-available oxalic acid-based etchant are used properly.

If conventional amorphous silicon (Si) is used in a semiconductor active layer, a pattern is formed by dry etching. This facilitates formation of what is called a tapered shape of forming the cross section of a side wall corresponding to an end face of a semiconductor pattern into a gently sloping shape.

In contrast, if an oxide semiconductor film is used in a semiconductor active layer, a pattern is formed by wet etching. Wet etching is isotropic etching. Thus, a side wall of the patterned oxide semiconductor film becomes substantially vertical.

This may be a cause for a coverage failure of a film formed on the oxide semiconductor film. As an example, the step coverage characteristics of a TFT structure will be degraded at a source electrode and a drain electrode formed so as to cover a side wall of the pattern of the oxide semiconductor film and at respective side walls of a source wiring and a drain wiring, leading to a problem such as a break in a wiring film. This further causes the problem of degradation of the step coverage characteristics of a protective insulating film formed on the wiring film.

Using a film of metal such as aluminum (Al), titanium (Ti), chromium (Cr), copper (Cu), molybdenum (Mo), tantalum (Ta), tungsten (W), or an alloy of these metals for forming a source electrode and a drain electrode of a TFT causes a problem in that it becomes difficult to obtain favorable interfacial electrical characteristics stably at an electrical junction between the source electrode and the oxide semiconductor film and between the drain electrode and the oxide semiconductor film. Further, increase in interfacial electrical resistance causes a problem in that it hinders the oxide semiconductor film having high mobility from offering its performance significantly.

Japanese Patent Application Laid-Open No. 2010-123937 mentioned above discloses a technique responsive to the aforementioned problems. According to this technique, a side wall corresponding to an end face formed of a pattern of an oxide semiconductor film, that of an ohmic contact layer, that of a source electrode, and that of a drain electrode is tapered by wet etching.

However, Japanese Patent Application Laid-Open No. 2010-123937 does not disclose a specific method and a specific condition for the wet etching to become matters to be considered for formation of a tapered shape. Referring particularly to patterning of a multilayer film, unlike formation of a tapered shape using dry etching, formation of a tapered shape using wet etching results in a canopy structure (hereinafter called a "notch structure" in some cases), for example. This makes it difficult to form a side wall corresponding to an end face of a pattern into a shape realistically that enhances step coverage characteristics at respective side walls of a source electrode, a drain electrode, a source wiring, and a drain wiring.

SUMMARY OF THE INVENTION

It is an object of the present invention to provide a thin-film transistor preventing a failure due to a break in a wiring of a source electrode and a drain electrode formed on a semiconductor layer including an oxide semiconductor film and achieving excellent electrical characteristics at a connection interface between the source electrode and the oxide semiconductor film and between the drain electrode and the oxide semiconductor film, an active matrix substrate including the thin-film transistor, and a method of manufacturing a thin-film transistor and a method of manufacturing an active matrix substrate capable of manufacturing the aforementioned thin-film transistor and active matrix substrate easily with high yields.

A thin-film transistor of the present invention includes a gate electrode, a gate insulating film, a semiconductor layer, a source electrode, and a drain electrode. The gate electrode, the gate insulating film, and the semiconductor layer are stacked in order on a substrate. The source electrode and the drain electrode are arranged separately so as to face each other on the semiconductor layer.

The semiconductor layer has two layers including an oxide semiconductor film and an oxide conductive film. The oxide semiconductor film is stacked on the gate insulating film and made of an oxide semiconductor. The oxide conductive film is stacked on the oxide semiconductor film and made of a conductive oxide.

The source electrode and the drain electrode are electrically connected to the oxide semiconductor film through the oxide conductive film at least at an end portion of the source electrode and an end portion of the drain electrode facing each other.

At the semiconductor layer placed between the source electrode and the drain electrode facing each other, a channel region is formed by the oxide semiconductor film.

The oxide semiconductor film has a substantially tapered shape in cross section at an end face thereof.

The thin-film transistor of the present invention is capable of enhancing its electrical characteristics by enhancing electrical characteristics at a connection interface between the source electrode and the oxide semiconductor film and between the drain electrode and the oxide semiconductor film. The thin-film transistor of the present invention is also capable of preventing a failure due to a break in a wiring of the source electrode and the drain electrode formed on the semiconductor layer including the oxide semiconductor film. Thus, a failure due to a break is prevented that is to occur in the wiring of the source electrode and the drain electrode formed on the semiconductor layer including the oxide semiconductor film, making it possible to achieve a thin-film transistor with excellent electrical characteristics at the connection interface between the source electrode and the oxide semiconductor film and between the drain electrode and the oxide semiconductor film.

An active matrix substrate of the present invention includes a pixel electrode and multiple switching elements connected to the pixel electrode. Each of the switching elements is the thin-film transistor of the present invention.

The active matrix substrate of the present invention prevents a failure due to a break in the wiring of the source electrode and the drain electrode formed on the semiconductor layer including the oxide semiconductor film. This makes it possible to achieve an active matrix substrate including a thin-film transistor with excellent electrical characteristics at the connection interface between the source electrode and the oxide semiconductor film and between the drain electrode and the oxide semiconductor film.

A method of manufacturing a thin-film transistor of the present invention is to manufacture a thin-film transistor including a gate electrode, a gate insulating film, a semiconductor layer, a source electrode, and a drain electrode. The gate electrode, the gate insulating film, and the semiconductor layer are stacked in order on a substrate. The source electrode and the drain electrode are arranged separately so as to face each other on the semiconductor layer. The method of manufacturing a thin-film transistor of the present invention includes the steps of: forming the gate electrode and the gate insulating film in order on the substrate; forming an oxide semiconductor film made of an oxide semiconductor containing tin oxide on the gate insulating film; forming an oxide conductive film made of a conductive oxide containing zinc oxide on the oxide semiconductor film, thereby forming the semiconductor layer having two layers including the oxide semiconductor film and the oxide conductive film stacked on the oxide semiconductor film; and wet etching the semiconductor layer.

The semiconductor layer including the oxide semiconductor film can be easily formed into a substantially tapered shape in cross section at an end face thereof by the method of manufacturing a thin-film transistor of the present invention. This can suppress the occurrence of a break in a wiring of the source electrode and the drain electrode formed on the semiconductor layer, thereby enhancing the yield of the thin-film transistor as a product.

The source electrode and the drain electrode can electrically be connected to the oxide semiconductor film through the oxide conductive film at least at an end portion of the source electrode and an end portion of the drain electrode facing each other. This enhances electrical characteristics at a connection interface between the source electrode and the oxide semiconductor film and between the drain electrode and the oxide semiconductor film, thereby enhancing the electrical characteristics of the thin-film transistor.

Thus, a failure due to a break is prevented that is to occur in the wiring of the source electrode and the drain electrode formed on the semiconductor layer including the oxide semiconductor film, making it possible to manufacture a thin-film transistor easily with high yields having excellent electrical characteristics at the connection interface between the source electrode and the oxide semiconductor film and between the drain electrode and the oxide semiconductor film.

A method of manufacturing an active matrix substrate of the present invention is to manufacture an active matrix substrate including a pixel electrode and multiple switching elements connected to the pixel electrode. The method of manufacturing an active matrix substrate of the present invention includes the step of forming a thin-film transistor as each of the switching elements by the aforementioned method of manufacturing a thin-film transistor of the present invention.

The method of manufacturing an active matrix substrate of the present invention prevents a failure due to a break that is to occur in the wiring of the source electrode and the drain electrode formed on the semiconductor layer including the oxide semiconductor film. This makes it possible to manufacture an active matrix substrate including a thin-film transistor easily with high yields having excellent electrical characteristics at the connection interface between the source electrode and the oxide semiconductor film and between the drain electrode and the oxide semiconductor film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a sectional view showing a state at a stage when etching of the oxide semiconductor film 15 and the oxide conductive film 16 is finished;

FIG. 10 is a sectional view showing a state at a stage when removal of the photoresist pattern 23 is finished;

FIG. 11 is a sectional view showing a state at a stage when formation of the oxide conductive film 16 is finished;

FIG. 12 is a sectional view showing a state at a stage when formation of the photoresist pattern 23 is finished;

FIG. 13 is a sectional view showing a state at a stage halfway through the etching of the oxide semiconductor film 15 and the oxide conductive film 16;

FIG. 14 is a sectional view showing a state at a stage when the etching of the oxide semiconductor film 15 and the oxide conductive film 16 is finished; and FIG. 15 is a sectional view showing a state at a stage when removal of the photoresist pattern 23 is finished.

EMBODIMENT FOR CARRYING OUT THE INVENTION

Figure 1:
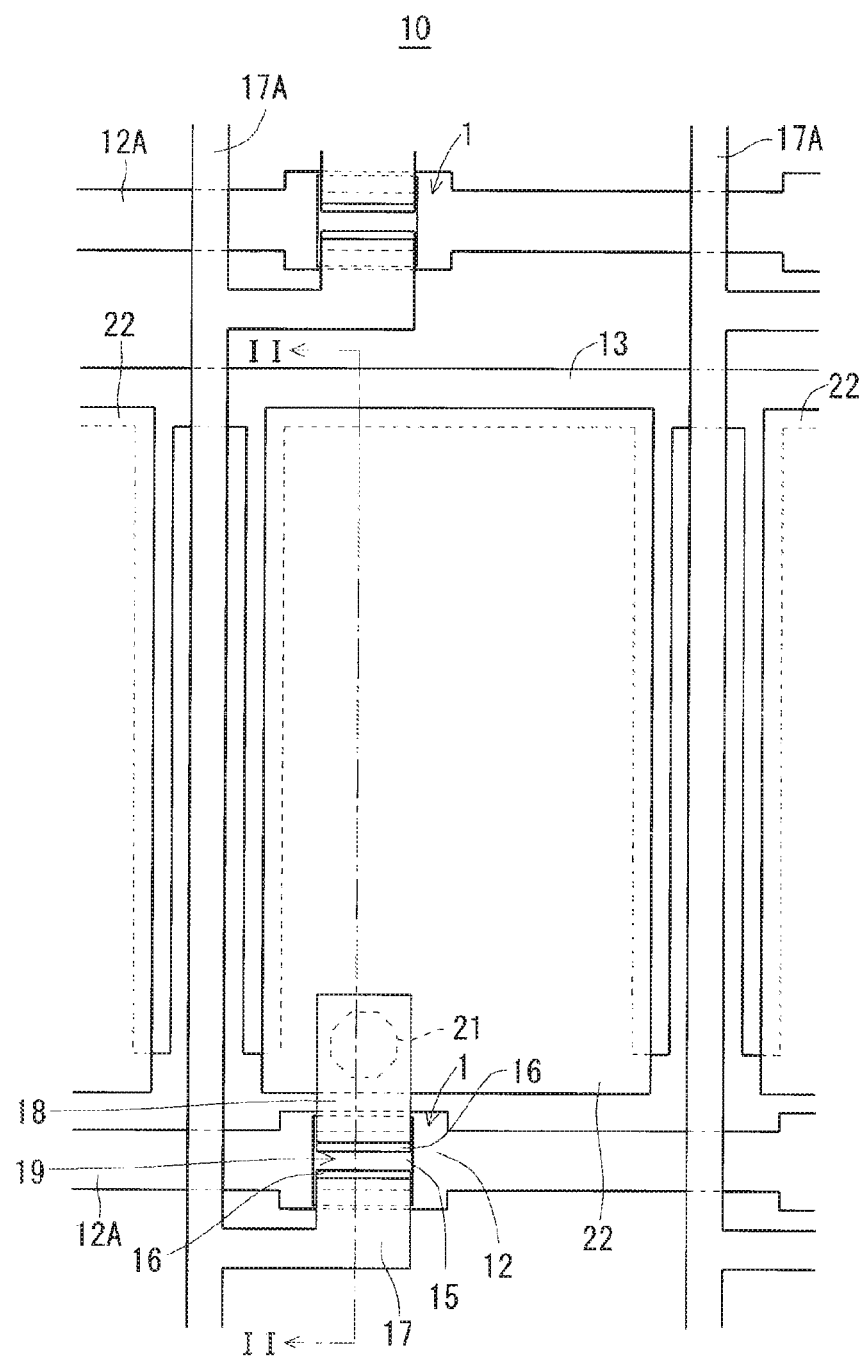
FIG. 1 is a plan view showing the structure of an active matrix substrate 10 including a thin-film transistor 1 of a preferred embodiment of the present invention.
Figure 2:
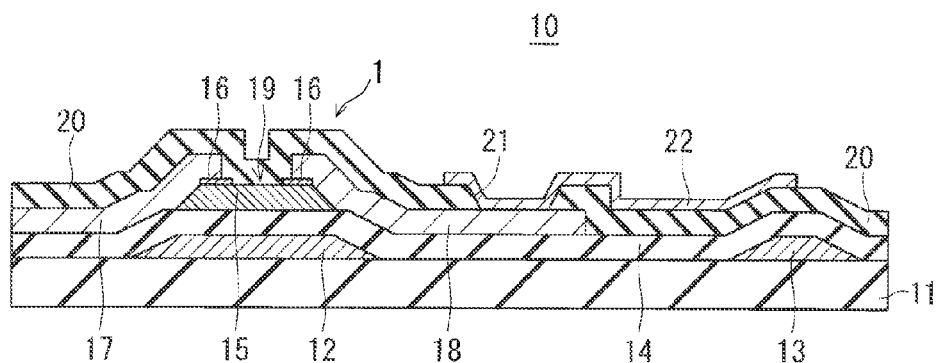
FIG. 2 is a sectional view showing a cross-sectional structure taken along a cutting line II-II of FIG. 1.

FIG. 1 is a plan view showing the structure of an active matrix substrate 10 including a thin-film transistor 1 of a preferred embodiment of the present invention. FIG. 2 is a sectional view showing a cross-sectional structure taken along a cutting line II-II of FIG. 1. In this preferred embodiment, the active matrix substrate 10 including a thin-film transistor (abbreviated as a TFT) 1 as a switching element is described as a thin-film transistor substrate including the TFT 1. The active matrix substrate 10 of this preferred embodiment is a TFT active matrix substrate for a display device to be used in a display device.

The active matrix substrate 10 includes a transparent insulating substrate 11 such as a glass substrate, a gate electrode 12, a gate wiring 12A, an auxiliary capacitance electrode 13, a gate insulating film 14, an oxide semiconductor film 15, an oxide conductive film 16, a source electrode 17, a source wiring 17A, a drain electrode 18, a protective insulating film 20, and a pixel electrode 22.

The gate wiring 12A extends in the horizontal direction in the plane of the sheet of FIG. 1 and is connected to the gate electrode 12. The source wiring 17A extends in the vertical direction in the plane of the sheet of FIG. 1 and is connected to the source electrode 17. The gate wiring 12A and the auxiliary capacitance electrode 13 are formed simultaneously with the gate electrode 12. The source wiring 17A is formed simultaneously with the source electrode 17.

The oxide semiconductor film 15 and the oxide conductive film 16 form a semiconductor layer. In other words, the semiconductor layer has two layers including the oxide semiconductor film 15 and the oxide conductive film 16. More specifically, the oxide semiconductor film 15 is stacked on the gate insulating film 14 and is made of an oxide semiconductor. The oxide conductive film 16 is stacked on the oxide semiconductor film 15 and is made of a conductive oxide. The semiconductor layer has two layers including the oxide semiconductor film 15 and the oxide conductive film 16 stacked on each other.

The gate electrode 12, the gate insulating film 14, and the semiconductor layer are stacked in this order on the transparent insulating substrate 11. In this preferred embodiment, the semiconductor layer has two layers including the oxide semiconductor film 15 and the oxide conductive film 16.

In the cross-sectional structure of FIG. 2, the source electrode 17 and the drain electrode 18 are arranged separately so as to face each other on the semiconductor layer. A region of the semiconductor layer between the source electrode 17 and the drain electrode 18 facing each other, specifically the region of the semiconductor layer placed between the pattern of the source electrode 17 and that of the drain electrode 18 becomes a channel region 19 of the TFT 1. Removing the oxide conductive film 16 forms the channel region 19 out of the oxide semiconductor film 15. The channel region 19 functions as a back channel region.

The source electrode 17 and the drain electrode 18 are electrically connected to the oxide semiconductor film 15 through the oxide conductive film 16 at least at an end portion of the source electrode 17 and an end portion of the drain electrode 18 facing each other. Specifically, the source electrode 17 and the drain electrode 18 may be electrically connected to the oxide semiconductor film 15 through the oxide conductive film 16 only at least at the end portion of the source electrode 17 and the end portion of the drain electrode 18 facing each other or at respective portions including the corresponding end portions facing each other. Alternatively, the source electrode 17 and the drain electrode 18 may be entirely connected electrically to the oxide semiconductor film 15 through the oxide conductive film 16.

The cross section of an end face of the oxide semiconductor film 15, more specifically the cross section of the end face covered with the source electrode 17 and the drain electrode 18 is formed into a substantially tapered shape. The "substantially tapered shape" mentioned herein includes a tapered shape and a shape analogous to the tapered shape.

The shape analogous to the tapered shape includes a forward stepwise shape described later, for example.

The protective insulating film 20 protects the channel region 19 and is formed over the entire transparent insulating substrate 11. The protective insulating film 20 is provided with a pixel drain contact hole 21 penetrating the protective insulating film 20 to reach a surface of the drain electrode 18 in a lower layer. The pixel electrode 22 is formed of a light-transmitting conductive film and is electrically connected through the pixel drain contact hole 21 to the drain electrode 18 in the lower layer.

The active matrix substrate 10 including the TFT 1 of this preferred embodiment is manufactured for example as follows. FIGS. 3 to 7 show steps of manufacturing the active matrix substrate 10.

Figure 3:
FIG. 3 is a sectional view showing a state at a stage when formation of a gate electrode 12 and an auxiliary capacitance electrode 13 is finished.

FIG. 3 is a sectional view showing a state at a stage when formation of the gate electrode 12 and the auxiliary capacitance electrode 13 is finished. First, the transparent insulating substrate 11 such as a glass substrate is cleaned with a cleaning liquid or pure water. Then, a first metal film to become the gate electrode 12 and the auxiliary capacitance electrode 13 is deposited. Examples of a material for the first metal film include chromium (Cr), molybdenum (Mo), titanium (Ti), tantalum (Ta), tungsten (W), aluminum (Al), and an alloy containing any of these elements and a tiny amount of a different element. The first metal film may have a stacked structure including two or more layers each containing any of these metals or any of such alloys. Using any of these metals or any of such alloys allows the first metal film to be a low-resistance film of a specific resistance value of 50 μΩcm or less.

In this preferred embodiment, an Mo film is deposited as the first metal film for example by sputtering process using argon (Ar) gas to a thickness such as 200 nm. However, this is not the only thickness for the first metal film. The thickness of the first metal film can be set at a value by which a desired wiring resistance can be acquired. As an example, the thickness of the first metal film is determined properly depending on the specific resistance value of a metal film used as the first metal film.

To maintain a film quality, it is preferable that the thickness of the first metal film be 5 nm or more. To prevent reduction in productivity and peeling of the film due to stress, it is preferable that the thickness of the first metal film be 500 nm or less. Specifically, it is preferable that the thickness of the first metal film be 5 nm or more and 500 nm or less.

Next, a photoresist pattern is formed in a first photolithography step. Using the resultant photoresist pattern as a mask, wet etching is performed with an etchant. A PAN chemical containing phosphoric acid, acetic acid, and nitric acid is used as the etchant, for example. The temperature of the PAN chemical is set at 40° C., for example.

After the wet etching, the photoresist pattern is removed. As a result of the aforementioned wet etching process, the gate electrode 12 and the auxiliary capacitance electrode 13 are formed.

It is preferable that the PAN chemical used in this wet etching process contain phosphoric acid in a range from 40 to 93 wt. % (percent by weight), acetic acid in a range from 1 to 40 wt. %, and nitric acid in a range from 0.5 to 15 wt. %. The PAN chemical used in this preferred embodiment contains 70 wt. % of phosphoric acid, 7 wt. % of acetic acid, 5 wt. % of nitric acid, and the remaining percent by weight of water, for example. As a result, the cross section of a side wall of the pattern of the gate electrode 12 and that of a side wall of the pattern of the auxiliary capacitance electrode 13 both formed of the Mo film can be formed into a substantially tapered shape as shown in FIG. 3.

Figure 4:
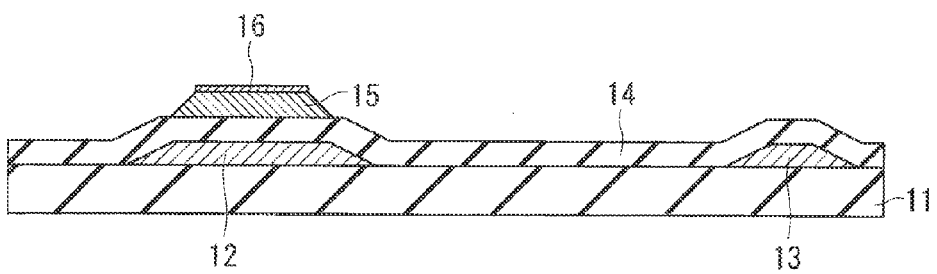
FIG. 4 is a sectional view showing a state at a stage when formation of a gate insulating film 14, an oxide semiconductor film 15, and an oxide conductive film 16 is finished.

FIG. 4 is a sectional view showing a state at a stage when formation of the gate insulating film 14, the oxide semiconductor film 15, and the oxide conductive film 16 is finished. After the gate electrode 12 and the auxiliary capacitance electrode 13 are formed in the aforementioned way, the gate insulating film 14, the oxide semiconductor film 15, and the oxide conductive film 16 are deposited in order to form a semiconductor pattern of the TFT 1. The following specifically describes steps of forming the gate insulating film 14, the oxide semiconductor film 15, and the oxide conductive film 16 of FIG. 4 by referring to FIGS. 8 to 10.

Figure 8:
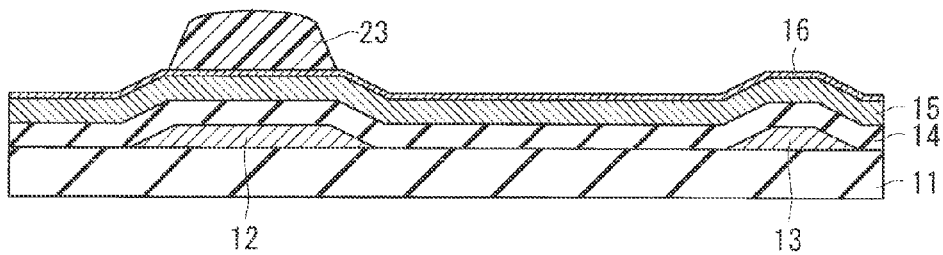
FIG. 8 is a sectional view showing a state at a stage when formation of a photoresist pattern 23 is finished.

FIG. 8 is a sectional view showing a state at a stage when formation of a photoresist pattern 23 is finished. After the gate electrode 12 and the auxiliary capacitance electrode 13 shown in FIG. 3 are formed in the aforementioned way, the gate insulating film 14 is formed first on the entire transparent insulating substrate (hereinafter simply called a "substrate" in some cases) 11 on which the gate electrode 12 and the auxiliary capacitance electrode 13 are formed.

In this preferred embodiment, a silicon oxide (SiO) film is deposited as the gate insulating film 14 to a thickness of 300 nm under a substrate heating condition of about 300° C. using chemical vapor deposition (abbreviated as CVD) process, for example. However, these are not the only method for depositing the gate insulating film 14, not the only temperature for heating the substrate 11, and not the only the thickness for the gate insulating film 14.

The thickness of the gate insulating film 14 can be set at any value by which a desired electric field intensity required for the operation of the TFT 1 can be acquired. As an example, the thickness of the gate insulating film 14 is determined properly depending on the dielectric constant of an insulating film used as the gate insulating film 14. To maintain a film quality, it is preferable that the thickness of the gate insulating film 14 be 5 nm or more. To prevent peeling of the film due to stress, it is preferable that the thickness of the gate insulating film 14 be 3000 nm or less. Specifically, it is preferable that the thickness of the gate insulating film 14 be 5 nm or more and 3000 nm or less. If an insulating film formed by coating is used as the gate insulating film 14, it is preferable that the thickness of the gate insulating film 14 be 1000 nm or more and 3000 nm or less.

The barrier performance, specifically blocking performance of the silicon oxide film is low against impurity elements such as water ($H_2O$), hydrogen ($H_2$), sodium (Na), and potassium (K) that are influential on TFT characteristics. Thus, if the silicon oxide film is used as the gate insulating film 14, a film of excellent barrier performance such as a silicon nitride (SiN) film may be provided below the silicon oxide film to form the gate insulating film 14 into a stacked structure.

Next, a stacked structure including the oxide semiconductor film 15 in a lower layer and the oxide conductive film 16 in an upper layer is deposited for example by sputtering process. The oxide semiconductor mentioned herein in principle has an n-type conductivity type and a conductivity of $1 \times 10^{-7}$ S/cm or more and 10 S/cm or less or has a concentration of electrons to become carriers (hereinafter called a "carrier concentration" in some cases) that is $1 \times 10^{11}/cm^3$ or more and $10^{18}/cm^3$ or less.

The conductivity being higher than 10 S/cm and the carrier concentration being higher than $1 \times 10^{18}/cm^3$ easily cause a current to flow all the time. This makes a current called an off current flow even when the TFT is off, thereby disabling switching function of the semiconductor film in some cases. Thus, it is preferable that the conductivity be 10 S/cm or less and the carrier concentration be $10^{18}/cm^3$ or less.

The conductivity being lower than $1\times10^{-7}$ S/cm and the carrier concentration being lower than $1\times10^{11}/cm^3$ result in substantially no flow of an on current even when the TFT is on, thereby disabling the switching function in some cases. Thus, it is preferable that the conductivity be $1\times10^{-7}$ S/cm or more and the carrier concentration be $1\times10^{11}/cm^3$ or more.

As understood from the foregoing, it is preferable that the oxide semiconductor have the conductivity of $1\times10^{-7}$ S/cm or more and 10 S/cm or less or have the carrier concentration of $1\times10^{11}/cm^3$ or more and $10^{18}/cm^3$ or less. It is more preferable that the oxide semiconductor have the conductivity of $1\times10^{-5}$ S/cm or more and $1\times10^{-1}$ S/cm or less or have the carrier concentration of $1\times10^{12}/cm^3$ or more and $1\times10^{17}/cm^3$ or less.

The TFT 1 having higher mobility than amorphous silicon can be achieved by using the oxide semiconductor film 15 made of the aforementioned oxide semiconductor to form the channel region 19. Meanwhile, the oxide conductive film 16 in the upper layer has a conductivity of $1\times10$ S/cm or more, more preferably $1\times10^2$ S/cm or more, so that it is formed as what is called a conductive film.

In this preferred embodiment, the oxide semiconductor film 15 in the lower layer is made of an In—Zn—Sn—O-based oxide prepared by adding indium oxide ($In_2O_3$) and tin oxide ($SnO_2$) to zinc oxide (ZnO). More specifically, an In—Zn—Sn—O target having an atomic composition ratio In:Zn:Sn:O=2:6:2:13 [$In_2O_3.(ZnO)_6.(SnO_2)_2$] is subjected to sputtering with a mixed gas prepared by adding 10% of an oxygen ($O_2$) gas in terms of a partial pressure ratio to an Ar gas to deposit the oxide semiconductor film 15 to a thickness of 40 nm. However, these are not the only material, deposition method, and thickness for the oxide semiconductor film 15. To maintain a film quality, it is preferable that the oxide semiconductor film 15 have a thickness of 5 nm or more.

Next, an In—Zn—O-based oxide conductive film prepared by adding indium oxide ($In_2O_3$) to zinc oxide (ZnO) is deposited to form the oxide conductive film 16 in the upper layer. More specifically, an In—Zn—O target containing $In_2O_3$ and ZnO combined in a ratio of 90 wt. % and 10 wt. % respectively is subjected to sputtering with an Ar gas to deposit the oxide conductive film 16 to a thickness of 20 nm.

However, these are not the only material, deposition method, and thickness for the oxide conductive film 16. In terms of formation of a favorable tapered shape, it is preferable that the oxide conductive film 16 be thinner than the oxide semiconductor film 15. It is more preferable that the thickness of the oxide conductive film 16 be half the thickness of the oxide semiconductor film 15 or less.

The In—Zn—Sn—O-based oxide semiconductor film 15 deposited under the aforementioned condition has a conductivity of $1.5\times10^{-5}$ S/cm and a carrier concentration of $1.1\times10^{14}/cm^3$, for example. The In—Zn—O-based oxide conductive film 16 deposited under the aforementioned condition has a conductivity of $1.8\times10^3$ S/cm and a carrier concentration of $7.4\times10^{20}/cm^3$, for example.

Both the oxide semiconductor film 15 and the oxide conductive film 16 are oxide-based films. Thus, stacking these films does not cause reduction reaction at an interface therebetween. This prevents formation of a damage layer.

Next, the photoresist pattern 23 is formed in a second photolithography step. In this preferred embodiment, a novolac resin-based positive photoresist is first applied to a thickness such as about 1.6 μm using a slit coater or a spin coater. A next step is exposure to light with a photomask. Then, development is performed with an organic alkaline developer containing tetramethylammonium hydroxide (abbreviated as TMAH) to form the photoresist pattern 23. However, these are not the only material, formation method, thickness, and developer for the photoresist pattern 23.

FIG. 9 is a sectional view showing a state at a stage when etching of the oxide semiconductor film 15 and the oxide conductive film 16 is finished. After the photoresist pattern 23 is formed in the aforementioned way, a part of the oxide conductive film 16 and that of the oxide semiconductor film 15 not covered with the photoresist pattern 23 are removed by etching using the resultant photoresist pattern 23 as a mask and an etchant that is for example an oxalic acid solution.

FIG. 10 is a sectional view showing a state at a stage when removal of the photoresist pattern 23 is finished. After the oxide conductive film 16 and the oxide semiconductor film 15 are etched in the aforementioned way, the photoresist pattern 23 is removed by stripping for example with a stripping agent. As a result, the oxide conductive film 16 and the oxide semiconductor film 15 are formed into a tapered shape shown in FIG. 10.

The steps shown in FIGS. 8 to 10 for forming the gate insulating film 14, the oxide semiconductor film 15, and the oxide conductive film 16 are described in more detail below by referring to FIGS. 11 to 15. To facilitate understanding, only an area covering the gate insulating film 14, the oxide semiconductor film 15, the oxide conductive film 16, and the photoresist pattern 23 is shown in FIGS. 11 to 15.

FIG. 11 is a sectional view showing a state at a stage when formation of the oxide conductive film 16 is finished. The state of FIG. 11 corresponds to a state when formation of the oxide conductive film 16 is finished in the aforementioned steps of forming the gate insulating film 14, the oxide semiconductor film 15, the oxide conductive film 16, and the photoresist pattern 23 shown in FIG. 8. As shown in FIG. 11, the gate insulating film 14, the oxide semiconductor film 15, and the oxide conductive film 16 are formed in the aforementioned way.

FIG. 12 is a sectional view showing a state at a stage when formation of the photoresist pattern 23 is finished. The state of FIG. 12 corresponds to a state when formation of the photoresist pattern 23 is finished in the aforementioned steps of forming the gate insulating film 14, the oxide semiconductor film 15, the oxide conductive film 16, and the photoresist pattern 23 shown in FIG. 8. As shown in FIG. 12, the photoresist pattern 23 is formed on the oxide conductive film 16 formed in the aforementioned way.

FIG. 13 is a sectional view showing a state at a stage halfway through the etching of the oxide semiconductor film 15 and the oxide conductive film 16. FIG. 14 is a sectional view showing a state at a stage when the etching of the oxide semiconductor film 15 and the oxide conductive film 16 is finished. FIG. 15 is a sectional view showing a state at a stage when removal of the photoresist pattern 23 is finished.

After the photoresist pattern 23 is formed in the aforementioned way, using an oxalic acid solution as an etchant under the temperature condition of the solution of 45° C., for example, the In—Zn—O-based oxide conductive film 16 as an oxide conductive film and the In—Zn—Sn—O-based oxide semiconductor film 15 are etched simultaneously.

At this time, the oxide semiconductor film 15 as a single-layer film is etched at a speed (rate) of 92 nm/min., whereas the oxide conductive film 16 as a single-layer film is etched at a speed (rate) of 220 nm/min., for example. In this case, the etching speed of the oxide semiconductor film 15 is half (½) the etching speed of the oxide conductive film 16 or less. However, these are not the only etching speeds of the oxide semiconductor film 15 and the oxide conductive film 16.

Etching proceeds isotropically by wet etching process with a chemical. Thus, the In—Zn—O film as the oxide conductive film 16 is etched further in the lateral direction, specifically in-plane direction of the film at a higher speed than the oxide semiconductor film 15. As shown in FIG. 13, in a period from an initial stage to an intermediate stage of the etching, the width of the oxide conductive film 16 becomes smaller than that of the photoresist pattern 23. Specifically, an end face of the oxide conductive film 16 recedes from an end face of the photoresist pattern 23. Meanwhile, the etching of the oxide semiconductor film 15 proceeds more slowly than the oxide conductive film 16. As a result, the receding of the oxide conductive film 16 forms a notch 24 like an undercut.

Formation of the notch 24 makes a chemical soak easily into a part corresponding to the notch 24, so that this part is etched at a higher speed than the remaining part. In this state, the oxide conductive film 16 in the upper layer and the oxide semiconductor film 15 in the lower layer are etched simultaneously, thereby forming the stacked structure including the oxide conductive film 16 and the oxide semiconductor film 15 into a tapered shape as shown in FIG. 14.

After the tapered shape is formed in this way, the residual photoresist pattern 23 is removed in the aforementioned way to obtain the oxide conductive film 16 and the oxide semiconductor film 15 of the tapered shape shown in FIG. 15.

To achieve the aforementioned progress of the etching, it is preferable that the etching be performed under a condition that makes the etching speed of the oxide conductive film 16 higher than that of the oxide semiconductor film 15. It is further preferable that "a thickness t1 of the oxide semiconductor film 15 be larger than a thickness t2 of the oxide conductive film 16 (t1>t2)".

If the thickness t1 of the oxide semiconductor film 15 is the same as the thickness t2 of the oxide conductive film 16, the oxide conductive film 16 in the upper layer and the oxide semiconductor film 15 in the lower layer are formed as independent steps. Even in this case, as long as a condition that "an etching speed V2 of the oxide conductive film 16 is higher than an etching speed V1 of the oxide semiconductor film 15 (V2>V1)" is satisfied, a forward stepwise shape is still formed with the end face of the oxide conductive film 16 in the upper layer receding from the end face of the oxide semiconductor film 15 in the lower layer. Thus, this condition is preferable as it achieves enhanced coverage of the protective insulating film 20 formed in a subsequent step.

It is preferable that the thickness t1 of the oxide semiconductor film 15 be twice the thickness t2 of the oxide conductive film 16 or more (t1≥2(t2)). Making the thickness t1 of the oxide semiconductor film 15 twice the thickness t2 of the oxide conductive film 16 or more (t1≥2(t2)) does not form the end face of the oxide semiconductor film 15 and the end face of the oxide conductive film 16 into a forward stepwise shape but it can form these end faces into a tapered shape shown in FIG. 15 as in this preferred embodiment. Forming the tapered shape is preferable as the tapered shape can enhance the coverage performance of the protective insulating film 20 compared to the forward stepwise shape.

After the oxide semiconductor film 15 and the oxide conductive film 16 are etched in the aforementioned way as shown in FIG. 9, the photoresist pattern 23 is removed by being stripped for example with an amine-based stripping agent. As a result, a semiconductor pattern including the oxide semiconductor film 15 and the oxide conductive film 16 shown in FIG. 10 is formed. The state of FIG. 10 corresponds to the state of FIG. 15.

Figure 5:
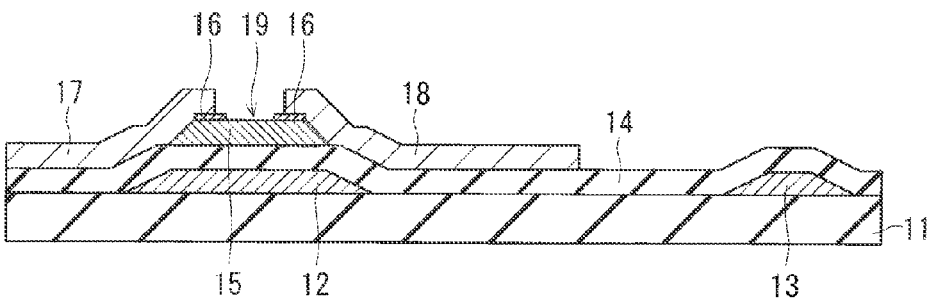
FIG. 5 shows a state at a stage when formation of a source electrode 17 and a drain electrode 18 is finished.

After the oxide semiconductor film 15 and the oxide conductive film 16 of the tapered shape shown in FIG. 4 are formed in the aforementioned way, a step of forming the source electrode 17 and the drain electrode 18 shown in FIG. 5 is performed. FIG. 5 shows a state at a stage when formation of the source electrode 17 and the drain electrode 18 is finished.

After the oxide semiconductor film 15 and the oxide conductive film 16 are etched, a second metal film to become the source electrode 17 and the drain electrode 18 is deposited over the transparent insulating substrate 11 over which the oxide semiconductor film 15 and the oxide conductive film 16 are formed into the tapered shape. The deposited second metal film is patterned to form the source electrode 17 and the drain electrode 18 such that the source electrode 17 and the drain electrode 18 face each other. Further, the oxide conductive film 16 existing in a region placed between the pattern of the source electrode 17 and that of the drain electrode 18 facing each other is removed, thereby forming the channel region 19 as a back channel region of the TFT 1.

Examples of a material for the second metal film include aluminum (Al), titanium (Ti), chromium (Cr), copper (Cu), molybdenum (Mo), tantalum (Ta), tungsten (W), and an alloy containing any of these elements and a tiny amount of a different element. The second metal film may have a stacked structure including two or more layers each containing any of these metals or any of such alloys. Using any of these metals or any of such alloys allows the second metal film to be a low-resistance film of a specific resistance value of 50 μΩcm or less.

In this preferred embodiment, an Mo film is deposited as the second metal film for example by publicly-known sputtering process using an argon (Ar) gas to a thickness such as 200 nm. Although not shown in the drawings, a photoresist pattern is formed thereafter in a third photolithography step. Using the resultant photoresist pattern as a mask, the Mo film as the second metal film and the oxide conductive film 16 are wet etched sequentially with the same etchant as the aforementioned etchant used for forming the gate electrode 12 and the auxiliary capacitance electrode 13 shown in FIG. 3, more specifically a PAN chemical containing phosphoric acid, nitric acid, and acetic acid.

At this lime, in the channel region 19 of the TFT 1, removing the second metal film by etching with the PAN chemical exposes a surface of the In—Zn—O-based oxide conductive film 16 and the In—Zn—O-based oxide conductive film 16 is further removed by etching in the PAN chemical. Removing the In—Zn—O-based oxide conductive film 16 by etching exposes a surface of the In—Zn—Sn—O-based oxide semiconductor film 15. Meanwhile, the In—Zn—Sn—O-based oxide semiconductor film 15 is practically insoluble in the PAN chemical. Thus, the In—Zn—Sn—O-based oxide semiconductor film 15 remains unremoved without being etched to become the channel region 19.

Next, the photoresist pattern is removed to obtain the source electrode 17, the drain electrode 18, and the channel region 19 of the TFT 1 shown in FIG. 5.

If the Mo film is used as the second metal film as in this preferred embodiment, the Mo film is etched to an amount in the lateral direction larger than the amount of the etching of the In—Zn—O-based oxide conductive film 16. In other words, the Mo film is etched in the lateral direction at a speed higher than the speed of the etching of the In—Zn—O-based oxide conductive film 16. This forms a difference in level between an end face of the oxide conductive film 16 and an end face of the source electrode 17 facing the channel region 19 and between an end face of the oxide conductive film 16 and an end face of the drain electrode 18 facing the channel region 19.

As a result, the coverage performance of the protective insulating film 20 described later can be enhanced. This can suppress the occurrence of a void in an end portion of the source electrode 17 and an end portion of the drain electrode 18, thereby eliminating the influence for example of water that may affect TFT characteristics. As a result, the high-quality TFT 1 and a device including the TFT 1 can be manufactured with high yields.

After the oxide conductive film 16 is removed from the channel region 19, the surface of the oxide semiconductor film 15 in the channel region 19 may be cleaned with an alkali solution containing TMAH or may be irradiated with plasma (hereinafter called "plasma treatment" in some cases).

The plasma treatment may process with plasma such as gas of helium (He), neon (Ne), argon (Ar), or nitrogen ($N_2$), or gas containing fluorine such as sulfur hexafluoride ($SF_6$), carbon tetrafluoride ($CF_4$), fluorine ($F_2$), hydrogen fluoride (HF), nitrogen trifluoride ($NF_3$), trifluoromethane ($CHF_3$), or hexafluoroethane ($C_2F_6$).

As a result of the plasma treatment with any of these gases, a foreign matter and a contaminant on the surface of the channel region 19 are removed. This achieves favorable off characteristics of the TFT 1, more specifically, reduction in an off current in the TFT 1.

Alternatively, the plasma treatment may proceed with an oxygen ($O_2$) gas or nitrous oxide ($N_2O$) gas. This plasma treatment supplies oxygen atoms to the surface of the oxide semiconductor film 15 in the channel region 19 in addition to removing the foreign matter and the contaminant from the surface of the channel region 19. This increases the resistance of the surface and its vicinity, thereby achieving more favorable off characteristics of the TFT 1.

Figure 6:
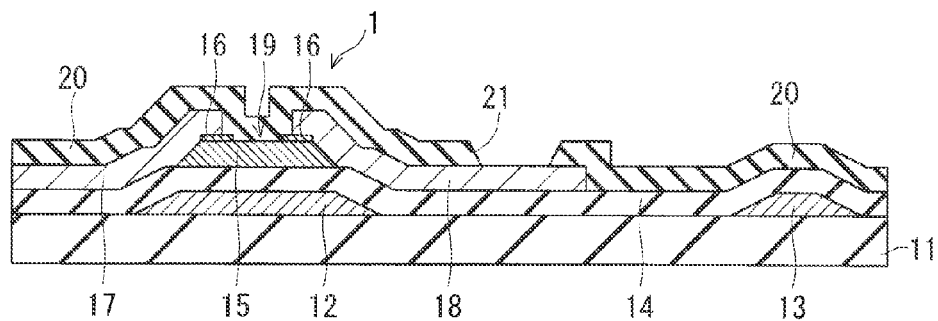
FIG. 6 is a sectional view showing a state at a stage when formation of a protective insulating film 20 is finished.

FIG. 6 is a sectional view showing a state at a stage when formation of the protective insulating film 20 is finished. After the source electrode 17 and the drain electrode 18 are formed in the aforementioned way, the protective insulating film 20 is deposited. In this preferred embodiment, a silicon oxide SiO film is deposited as the protective insulating film 20 to a thickness of 300 nm using CVD process under a substrate heating condition of about 250° C., for example. However, these are not the only material, deposition method, and substrate heating temperature for the protective insulating film 20.

Next, a photoresist pattern is formed in a fourth photolithography step. Then, the SiO film is etched by publicly-known dry etching process with a fluorine-based gas. The photoresist pattern is thereafter removed to form the pixel drain contact hole 21.

The barrier performance (blocking performance) of the silicon oxide film is low against impurity elements such as water ($H_2O$), hydrogen ($H_2$), and alkali metals such as sodium (Na) and potassium (K) that are influential on TFT characteristics. Thus, a film of excellent barrier performance such as a silicon nitride (SiN) film may be provided over the silicon oxide film to form the protective insulating film 20 into a stacked structure. Even if the protective insulating film 20 has such a stacked structure, the pixel drain contact hole 21 can still be formed using publicly-known dry etching process with a fluorine gas.

Figure 7:
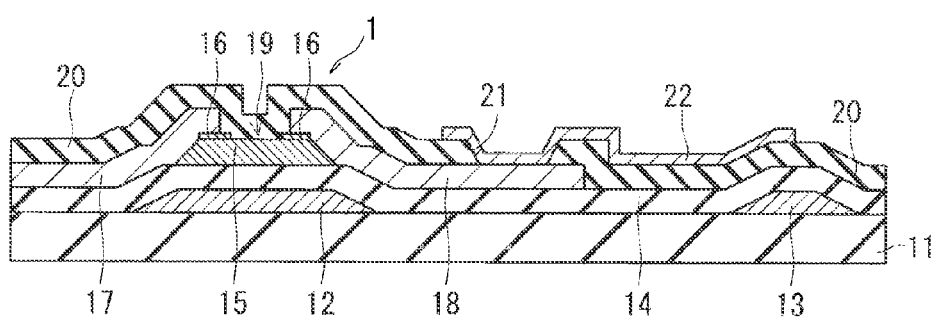
FIG. 7 is a sectional view showing a state at a stage when formation of a transparent pixel electrode 22 is finished.

FIG. 7 is a sectional view showing a state at a stage when formation of the transparent pixel electrode 22 is finished. After the pixel drain contact hole 21 is formed in the aforementioned way, a transparent conductive film to become the transparent pixel electrode 22 is formed in the pixel drain contact hole 21 entirely. The deposited transparent conductive film is patterned to form the transparent pixel electrode 22 for image display.

In this preferred embodiment, an In—Zn—O film described above as a base for the oxide conductive film 16 is deposited as the transparent conductive film by publicly-known sputtering process using an Ar gas to a thickness of 100 nm, for example. However, these are not the only material, deposition method, and thickness for the transparent conductive film.

Next, a photoresist pattern is formed in a fifth photolithography step. Using the resultant photoresist pattern as a mask, wet etching is performed for example with a publicly-known oxalic acid-based solution. Then, the photoresist pattern is removed to form the transparent pixel electrode 22. As a result, the TFT active matrix substrate 10 for a liquid crystal display according to this preferred embodiment shown in FIG. 1 is manufactured.

Although not shown in the drawings, to manufacture a liquid crystal display device using the TFT active matrix substrate 10 manufactured by the aforementioned five photolithography steps, an alignment film for example made of polyimide for liquid crystal orientation and a spacer are formed on a surface of the manufactured TFT active matrix substrate 10.

Then, the TFT active matrix substrate 10 and an opposite substrate including a color filter and the alignment film are bonded and a liquid crystal is injected into a gap between these substrates formed by the aforementioned spacer and held in the gap. Further, members including a polarizing plate, a phase difference plate, and a backlight unit are arranged outside these substrates to obtain the liquid crystal display device.

As described above, according to this preferred embodiment, the semiconductor layer is formed having two layers including the oxide semiconductor film 15 and the oxide conductive film 16 stacked on each other. The oxide conductive film 16 is formed so as to be etched with an etchant at a higher speed than the oxide semiconductor film 15. More specifically, the oxide conductive film 16 is made of a material by which the oxide conductive film 16 is etched at a higher speed than the oxide semiconductor film 15 with a PAN chemical containing phosphoric acid, nitric acid, and acetic acid. This allows the semiconductor layer including the oxide semiconductor film 15 and the oxide conductive film 16 to be easily formed into a substantially tapered shape in cross section at the end face of the semiconductor layer.

More specifically, the semiconductor layer is wet etched with an etchant that is a chemical containing oxalic acid or the PAN chemical containing phosphoric acid, nitric acid, and acetic acid. This facilitates formation of the semiconductor layer including the oxide semiconductor film 15 and the oxide conductive film 16 and having a substantially tapered shape in cross section at the end face of the semiconductor layer.

Forming the semiconductor layer including the oxide semiconductor film 15 and the oxide conductive film 16 into a substantially tapered shape in cross section at the end face of the semiconductor layer can suppress a break in the source electrode 17 and the drain electrode 18 over the oxide semiconductor film 15.

As a result of provision of the oxide conductive film 16, an end portion of the oxide conductive film 16 as a second semiconductor material having a connection interface area with the source electrode 17 and that with the drain electrode 18 recedes toward the inside from an end portion of the source electrode 17 and that of the drain electrode 18 at an end portion of a junction between the source electrode 17 and the semiconductor layer as a channel layer and at an end portion of a junction between the drain electrode 18 and the semiconductor layer. This suppresses concentration of an electric field on an end portion of an electrode, thereby obtaining favorable TFT characteristics.

The source electrode 17 and the drain electrode 18 are both electrically connected to the oxide semiconductor film 15 through the oxide conductive film 16 at least at an end portion of the source electrode 17 and an end portion of the drain electrode 18 facing each other. This enhances electrical characteristics at a connection interface between the source electrode 17 and an active layer in the oxide semiconductor film 15 and between the drain electrode 18 and this active layer. As a result, the high-performance TFT active matrix substrate 10 to operate at a relatively high speed and a display device including the TFT active matrix substrate 10 can be manufactured with high yields and high productivity by taking advantage of relatively high carrier mobility of the oxide semiconductor film 15.

In this preferred embodiment, the In—Zn—Sn—O-based oxide is used as a material for the oxide semiconductor film 15, the In—Zn—O-based oxide is used as a material for the oxide conductive film 16, and the oxalic acid-based chemical is used as an etchant. However, these are not the only oxides and the etchant. Any oxide and any etchant can be employed appropriately that make the etching speed V2 of the oxide conductive film 16 higher than the etching speed V1 of the oxide semiconductor film 15 (V2>V1) during wet etching.

If the oxalic acid-based chemical commonly used is selected as an etching chemical for an oxide-based conductive film and an oxide-based semiconductor film, not only an In—Zn—Sn—O-based film but also an oxide semiconductor film containing tin (Sn) can be selected as the oxide semiconductor film 15 such as a Zn—Sn—O-based film, an In—Al—Sn—O-based film, an In—Si—Sn—O-based film, or an In—Al—Zn—Sn—O-based film, for example. Specifically, the oxide semiconductor film 15 may contain tin oxide.

Using the oxide semiconductor film containing tin oxide can reduce the speed of etching of the oxide semiconductor film 15 with an oxalic acid-based chemical or a carboxylic acid-based chemical, compared to use of an oxide semiconductor film not containing tin oxide.

Not only an In—Zn—O-based film but also an oxide conductive film containing Zn—O can be selected as the oxide conductive film 16 such as a Zn—O-based film, a gallium (Ga)—Zn—O-based film, or an Al—Zn—O-based film, for example. Specifically, the oxide conductive film 16 may contain zinc oxide (ZnO). Using the oxide conductive film 16 containing zinc oxide (ZnO) facilitates formation of the oxide conductive film 16 that satisfies a condition that the speed V2 of etching of the oxide conductive film 16 with an oxalic acid chemical should be higher than the speed V1 of etching of the oxide semiconductor film 15 with the oxalic acid (V2>V1).

Heat treatment may be performed in a temperature of 200° C. or more and 450° C. or less after the oxide semiconductor film 15 is deposited. This temperature for the heat treatment is more preferably 300° C. or more and 400° C. or less. Performing the heat treatment can reduce the speed of etching of the oxide semiconductor film 15 further with an oxalic acid-based chemical.

The composition ratio of the elements of each of respective materials for the aforementioned oxide semiconductor film 15 and oxide conductive film 16 may be determined in a manner that achieves a desirable conductivity and a desirable carrier concentration of each of the oxide semiconductor film 15 and the oxide conductive film 16.

The aforementioned PAN chemical as an etching chemical for a metal film is applicable as an etching chemical for a combination of the aforementioned oxide semiconductor film 15 and oxide conductive film 16.

If the combination of the oxide semiconductor film 15 and the oxide conductive film 16 is to be etched with the PAN chemical, respective materials for the source electrode 17, the drain electrode 18, the oxide conductive film 16, and the oxide semiconductor film 15 may be determined such that an etching speed V3 of the source electrode 17 and the drain electrode 18, the etching speed V2 of the oxide conductive film 16, and the etching speed V1 of the oxide semiconductor film 15 becomes lower in this order (V3>V2>V1).

An Mo film, a Cu film, or an alloy film containing Mo and Cu may be employed appropriately as a metal film to form the source electrode 17 and the drain electrode 18 satisfying the aforementioned condition.

Specifically, the source electrode 17 and the drain electrode 18 may be made of a metal material capable of being etched with the PAN chemical. The metal material mentioned herein includes at least one selected from aluminum (Al), molybdenum (Mo), copper (Cu), and an alloy of these metals.

Using the aforementioned material for forming the source electrode 17 and the drain electrode 18 allows the source electrode 17 and the drain electrode 18 to be etched simultaneously with the oxide semiconductor film 15 and the oxide conductive film 16. This can reduce the number of photolithography steps, thereby simplifying manufacturing steps.

The preferred embodiments of the present invention can be combined freely within the scope of the invention. Further, any component of each of the preferred embodiments can be changed or omitted, where appropriate.

While the invention has been shown and described in detail, the foregoing description is in all aspects illustrative and not restrictive. It is therefore understood that numerous modifications and variations can be devised without departing from the scope of the invention.

What is claimed is:

1. A thin-film transistor comprising:
   a gate electrode, a gate insulating film, and a semiconductor layer stacked in order on a substrate; and
   a source electrode and a drain electrode arranged separately so as to face each other on said semiconductor layer, wherein
   said semiconductor layer has two layers including:
   an oxide semiconductor film stacked on said gate insulating film and made of an oxide semiconductor; and
   an oxide conductive film stacked on said oxide semiconductor film and made of a conductive oxide, said oxide conductive film being directly over, and contacting with, the upper surface of said oxide semiconductor film at any plane position in said oxide conductive film, said source electrode and said drain electrode are electrically connected to said oxide semiconductor film through said oxide conductive film at least at an end portion of said source electrode and an end portion of said drain electrode facing each other, at said semiconductor layer placed between said source electrode and said drain electrode facing each other, a channel region is formed by said oxide semiconductor film, said oxide semiconductor film has a substantially tapered shape in cross section at an end face thereof, at least one of said source electrode and said drain electrode covers said end face of said oxide semiconductor film, where said end face is substantially tapered, and said at least one of said source electrode and said drain electrode extends to a region outside said oxide semiconductor film when viewed in plan view, and in a region between said end portion of said source electrode and said end portion of said drain electrode facing each other when viewed in plan view, a portion of said oxide conductive film is separated such that a gap exists between said oxide conductive film disposed under said end portion of said source electrode and said oxide conductive film disposed under said end portion of said drain electrode, wherein said gap is filled with a protective insulating film.

2. The thin-film transistor according to claim 1, wherein, when viewed in plan view, said oxide semiconductor film does not extend over any edges of said gate electrode.

3. The thin-film transistor according to claim 1, wherein said oxide semiconductor film contains tin oxide, and
said oxide conductive film contains zinc oxide.

4. The thin-film transistor according to claim 3, wherein said oxide conductive film comprises an In—Zn—O-based oxide conductive film.

5. The thin-film transistor according to claim 4, wherein said source electrode and said drain electrode are made of a metal material including at least one selected from aluminum (Al), molybdenum (Mo), copper (Cu), and an alloy of these metals.

6. The thin-film transistor according to claim 1, wherein said oxide semiconductor film has a thickness twice the thickness of said oxide conductive film or more.

7. An active matrix substrate comprising a pixel electrode and multiple switching elements connected to said pixel electrode,
wherein each of said switching elements is the thin-film transistor as recited in claim 1.

8. The thin-film transistor according to claim 1, wherein said oxide conductive film has a conductivity of $1 \times 10^2$ S/cm or more, and said oxide semiconductor film has a conductivity of $1 \times 10^{-5}$ S/cm or more and $1 \times 10^{-1}$ S/cm or less.

9. An active matrix substrate comprising:
a gate electrode on a substrate;
a gate insulating film on said gate electrode;
an oxide semiconductor film on said gate insulating film;
a first oxide conductive film on said oxide semiconductor film;
a second oxide conductive film arranged separately so as to face said first oxide conductive film on said oxide semiconductor film, said first and second oxide conductive films being directly over, and contacting with, the upper surface of said oxide semiconductor film at any plane position in said first and second oxide conductive films;
a source electrode electrically connected to said first oxide conductive film; and
a drain electrode electrically connected to said second oxide conductive film, wherein
said oxide semiconductor film has a substantially tapered shape in cross section at a side wall thereof, and
at least one of said source electrode and said drain electrode covers said side wall of said oxide semiconductor film.

10. The active matrix substrate according to claim 9, wherein at least one of said source electrode and said drain electrode is directly in contact with said side wall of said oxide semiconductor film.

11. The active matrix substrate according to claim 9, wherein at least one of said source electrode and said drain electrode extends along said side wall of said oxide semiconductor film.

12. The active matrix substrate according to claim 9, wherein, when viewed in plan view, said oxide semiconductor film does not extend over any edges of said gate electrode.

13. The active matrix substrate according to claim 9, wherein said oxide semiconductor film contains tin oxide, and
said oxide conductive film contains zinc oxide.

14. The active matrix substrate according to claim 13, wherein said source electrode and said drain electrode are made of a metal material including at least one selected from aluminum (Al), molybdenum (Mo), copper (Cu), and an alloy of these metals.

15. The active matrix substrate according to claim 9, wherein said oxide conductive film has a conductivity of $1 \times 10^2$ S/cm or more, and said oxide semiconductor film has a conductivity of $1 \times 10^{-5}$ S/cm or more and $1 \times 10^{-1}$ S/cm or less.

* * * * *